United States Patent [19]
En et al.

[11] Patent Number: 6,087,271
[45] Date of Patent: Jul. 11, 2000

[54] METHODS FOR REMOVAL OF AN ANTI-REFLECTIVE COATING FOLLOWING A RESIST PROTECT ETCHING PROCESS

[75] Inventors: William G. En, Milpitas; Minh Van Ngo, Union City; Olov B. Karlsson, San Jose; Christopher F. Lyons, Fremont; Maria Chow Chan, San Jose, all of Calif.

[73] Assignee: Advanced Micro Devices, Inc., Sunnyvale, Calif.

[21] Appl. No.: 08/993,869

[22] Filed: Dec. 18, 1997

[51] Int. Cl.[7] .................................................. H01L 21/283
[52] U.S. Cl. ........................ 438/745; 438/706; 438/749; 438/750
[58] Field of Search ..................... 438/694, 696, 438/718, 723, 724, 738, 702, 759, 786, 700, 952, 745, 669; 427/503, 154

[56] References Cited

U.S. PATENT DOCUMENTS

| | | | |
|---|---|---|---|
| 4,415,383 | 11/1983 | Naem et al. | 438/301 |
| 4,876,582 | 10/1989 | Janning | 257/66 |
| 5,034,348 | 7/1991 | Hartswick et al. | 437/200 |
| 5,616,401 | 4/1997 | Kobayashi et al. | 428/212 |
| 5,710,067 | 1/1998 | Foote et al. | 437/238 |
| 5,911,887 | 6/1999 | Smith et al. | 438/612 |

OTHER PUBLICATIONS

S. Wolf, Silicon Processing for the VLSI Era, vol. 1, chapter 15: Wet Etching, Cleaning and Lift–off, pp. 516,518.

*Primary Examiner*—Benjamin L. Utech
*Assistant Examiner*—Lan Vinh

[57] ABSTRACT

A method is provided for removing an bottom anti-reflective coating (BARC) from a transistor gate following at least one etch back process associated with a spacer formation and/or subsequent resistor protect etching process or processes. The method eliminates the need to use HF acid in the stripping process by substantially reducing the thickness of the BARC during each of the etching back processes, such that, only a thin layer of BARC material remains that can be easily removed with phosphoric acid.

12 Claims, 5 Drawing Sheets

METHODS FOR REMOVAL OF AN ANTI-REFLECTIVE COATING FOLLOWING A RESIST PROTECT ETCHING PROCESS

RELATED APPLICATIONS

This application is related to co-pending applications Ser. Nos. 08/993,833 and 08/993,829 (Attorney Docket numbers 50100-452/1033-380 and 50100-4531/1033-381), each filed Dec. 18, 1997, entitled Methods For In-Situ Removal Of An Anti-Reflective Coating During An Oxide Resistor Protect Etching Process, and Methods For In-Situ Removal Of An Anti-Reflective Coating During A Nitride Resistor Protect Etching Process, respectively.

TECHNICAL FIELD

The present invention relates to semiconductor devices and manufacturing processes, and more particularly to methods for removing a bottom anti-reflective coating from within a semiconductor device during manufacture.

BACKGROUND ART

A continuing trend in semiconductor technology is to build integrated circuits with more and/or faster semiconductor devices. The drive toward this ultra large scale integration has resulted in continued shrinking of device and circuit dimensions and features. In integrated circuits having field-effect transistors, for example, one very important process step is the formation of the gate for each of the transistors, and in particular the dimensions of the gate. In many applications, the performance characteristics (e.g., switching speed) and size of the transistor are functions of the size (e.g., width) of the transistor's gate. Thus, for example, a narrower gate tends to produce a higher performance transistor (e.g., faster) that is inherently smaller in size (e.g., narrower width).

To pattern narrower transistor gates, a bottom anti-reflective coating (BARC) is often added between a gate material layer and a resist layer to reduce reflected waves during the patterning of the resist layer. Once the transistor gate has been formed and the remaining portions of the resist layer (i.e., the resist mask) have been stripped away, there is a need to remove the remaining portions of the BARC that are over the transistor's gate.

Inorganic BARC materials can be difficult to remove, and the removal process can result in damage to other materials. For example, if the BARC is made of silicon oxynitride, prior art BARC removal methods typically require using an HF acid dip to remove oxidized portions of the silicon oxynitride followed by a hot phosphoric acid strip. Unfortunately, the HF dip process can attack and damage exposed silicon dioxide.

Thus, there is a need for improved and more efficient methods for removing the BARC without requiring a HF dip process, which can damage the semiconductor wafer.

SUMMARY OF THE INVENTION

The present invention provides improved and more efficient methods for removing an anti-reflective coating, such as a BARC, without requiring an HF dip process, thereby reducing the likelihood of damaging the semiconductor wafer and/or device features.

In accordance with one aspect of the present invention, a portion of the anti-reflective coating is removed during at least one etching back process associated with at least one overlying dielectric layer. Because the etching back process tends to remove significant portions of the anti-reflective coating, including any potential oxidized skin that can form on a silicon oxynitride anti-reflective coating, there is no need to use a HF acid dip process to remove an oxidized skin from the remaining portion of the silicon oxynitride anti-reflective coating. Thus, the remaining portion of the silicon oxynitride anti-reflective coating, which is preferably very thin, can be stripped away using only a conventional phosphoric acid stripping process.

In accordance with certain embodiments of the present invention, there is provided a method for removing an anti-reflective coating from a gate within a semiconductor wafer without using HF acid. The method includes using a patterned anti-reflective coating, of an initial thickness, during the formation of the gate. The method includes depositing at least a first dielectric layer over the anti-reflective coating and then removing substantially all of the first dielectric layer located over the anti-reflective coating using a first plasma. The first plasma also removes a portion of the anti-reflective coating from the gate, such that a first remaining anti-reflective coating, having a first reduced thickness that is less than the initial thickness, is left on the gate. The method further includes stripping substantially all remaining portions of the anti-reflective coating from the gate using phosphoric acid and without using an HF acid.

In accordance with one embodiment of the present invention, the anti-reflective coating includes a thin film of silicon oxynitride, which is, after being reduced in thickness, less than approximately 200Å thick.

In certain preferred embodiments of the present invention, the method further includes depositing a second dielectric layer over the first remaining anti-reflective coating and removing substantially all of the second dielectric layer located over the first remaining anti-reflective coating using a second plasma. The second plasma also removes a portion of the first remaining anti-reflective coating from the gate, which leaves a second remaining anti-reflective coating on the gate. This second remaining anti-reflective coating has a second reduced thickness that is even less thick than the first reduced thickness.

Similarly, in still other embodiments of the present invention, the method further includes depositing a third dielectric layer over the second remaining anti-reflective coating and removing substantially all of the third dielectric layer located over the second remaining anti-reflective coating using a third plasma. The third plasma also removes a portion of the second remaining anti-reflective coating from the gate, which leaves a third remaining anti-reflective coating on the gate. This third remaining anti-reflective coating has a third reduced thickness that is even less thick than the second reduced thickness.

The foregoing and other features, aspects, and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF THE EXEMPLARY EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drawn to scale, but instead are drawn to illustrate the features of the present invention.

Figure 1A:
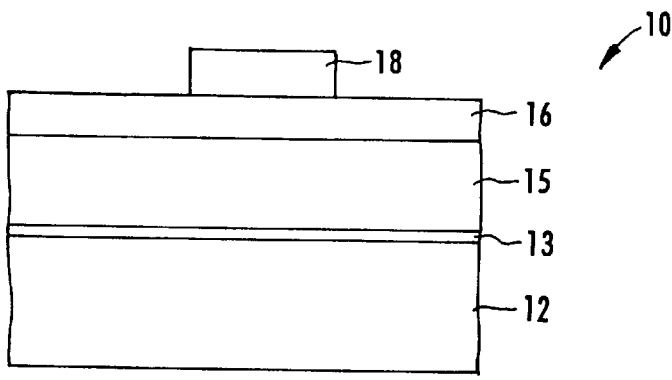
FIGS. 1a through 1d depict a cross-section of a portion of a semiconductor wafer during fabrication of a polysilicon gate therein using a bottom anti-reflective coating (BARC) and conventional etching techniques.

FIG. 1a depicts a cross-section of a portion 10 of a semiconductor wafer having a substrate 12 on which a gate oxide 13 has been formed. Substrate 12 is typically a silicon wafer, which may or may not be doped at this stage. Gate oxide 13 is typically a thin film of silicon dioxide, which has been grown on substrate 12. A layer of polysilicon 15 has been deposited over gate oxide 13. Polysilicon gates will be formed from polysilicon layer 15, as is known in the art. A bottom anti-reflective coating (BARC) layer 16 has been formed on polysilicon layer 15. BARC layer 16 is either an organic or an inorganic material. For example, BARC layer 16 can be made of an inorganic material such as a thin film of silicon oxynitride (e.g., $SiO_xN_y$). As is known, silicon oxynitride can be deposited using conventional deposition techniques, such as, for example, chemical vapor deposition (CVD) or like techniques.

Finally, a resist mask 18 has been patterned on BARC layer 16. Resist mask 18 is typically a developed photo resist material. As shown in FIG. 1a, resist mask 18 defines the width to which polysilicon layer 15 will be reduced by etching during gate formation. BARC layer 16 provides additional process control during the development and/or patterning of resist mask 18 by suppressing reflected waves during the lithographic development process, as is known in the art. BARC layer 16 is typically an organic or inorganic material that is configured to suppress reflected waves of a particular wavelength. For example, in one embodiment, BARC layer 16 is an inorganic material that includes silicon oxynitride ($SiO_xN_y$). In other embodiments, BARC layer 16 is an organic film that includes polymides or other like materials.

Figure 1B:
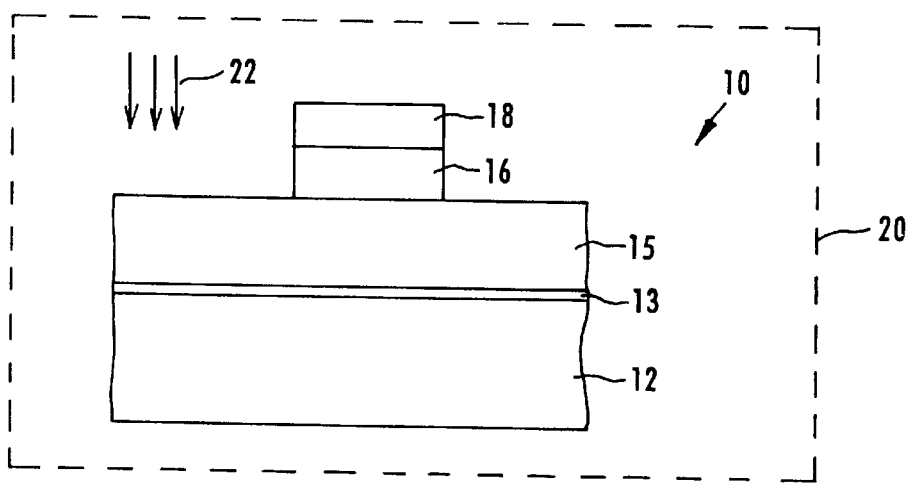
Figure 1C:
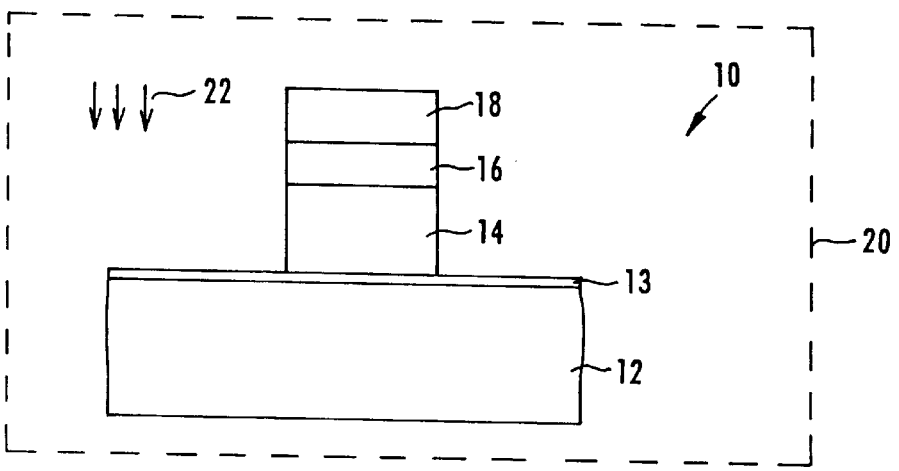

Portion 10, in FIG. 1b, has been placed in an etching tool 20 and exposed to an etching plasma 22 to anisotropically etch through BARC layer 16. In FIG. 1c, portion 10 has been further etched using etching plasma 22 to anisotropically etch through portions of polysilicon layer 15 to create a gate 14. Etching plasma 22 further etches away exposed portions of gate oxide 13 to create the patterned portion 10 depicted in FIG. 1d.

Figure 1D:
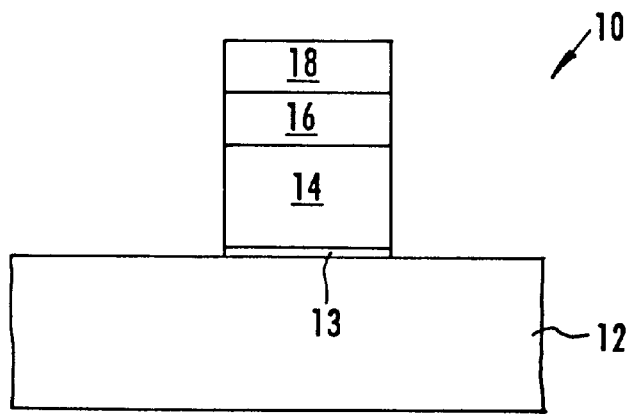
Figure 2:
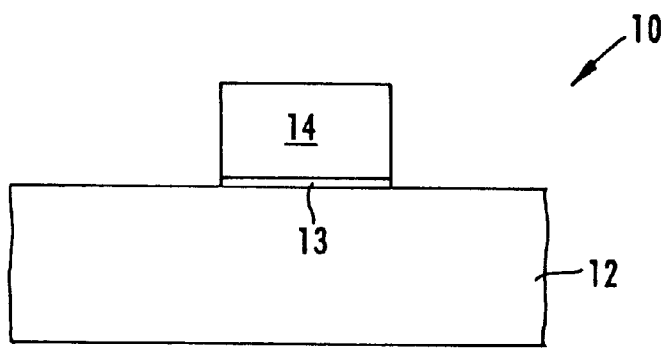
FIG. 2 depicts a cross-section of the portion in FIG. 1b following removal of a portion of the BARC using prior art techniques.

As shown in FIG. 1d, the gate etching process has been completed such that gate 14 and gate oxide 13 have been reduced to the width as established by resist mask 18. In a conventional gate formation process, at this stage, the remaining portions of resist mask 18 and BARC layer 16 need to be removed. This is typically accomplished using one or more conventional stripping methods.

For example, the remaining portions of resist mask 18 can be removed using a photo resist stripping technique. The remaining portions of BARC layer 16, if made of silicon oxynitride, can be stripped using a HF dip and a subsequent hot phosphoric acid dip. However, it has been found that damage can be done to various oxide materials within portion 10 when exposed to the HF dip. For example, exposed areas of substrate 12 having an oxide material can be chemically attacked and eroded or otherwise pitted by the HF dip. Thus, there is a need for improved methods for removing the remaining portions of BARC layer 16 from the top of polysilicon gate 14 without damaging or potentially damaging exposed oxide materials of portion 10.

Figure 3A:
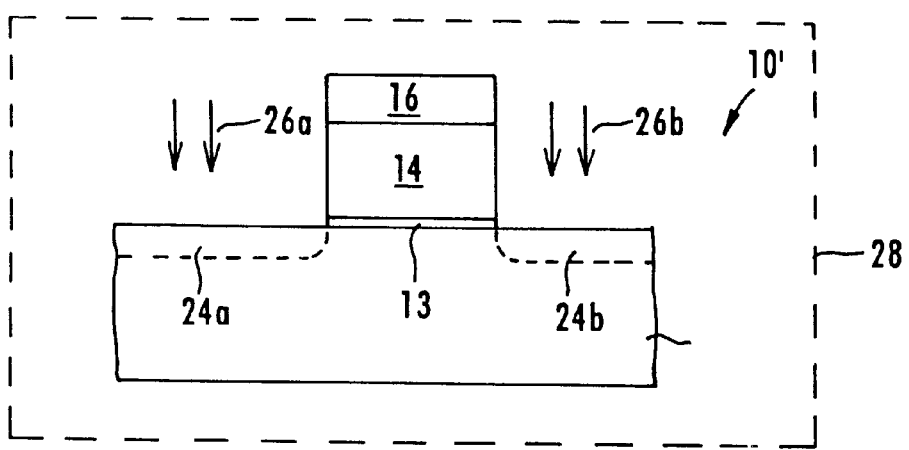
FIG. 3a depicts a portion of a semiconductor wafer having a patterned gate with a BARC during formation of lightly doped source and drain regions, in accordance with an embodiment of the present invention.

The disclosed embodiments of the present invention provide methods for removing the silicon oxynitride BARC layer 16 without exposing portion 10 to a HF dip. FIG. 3a depicts a cross-section of a portion of a semiconductor wafer in which a polysilicon gate 14 has been formed on a gate oxide 13, which is on a substrate 12. As depicted, BARC layer 16 has yet to be stripped off gate 14. BARC layer 16 is preferably made of silicon oxynitride, and gate 14 is preferably made of doped polysilicon, in accordance with certain embodiments of the present invention. Portion 10' in FIG. 3a has been placed in a doping tool 28, such as, for example, an ion implantation tool, and selectively exposed to one or more dopants 26a and/or 26b to form lightly doped source 24a, and lightly doped drain 24b, respectively.

Figure 3B:
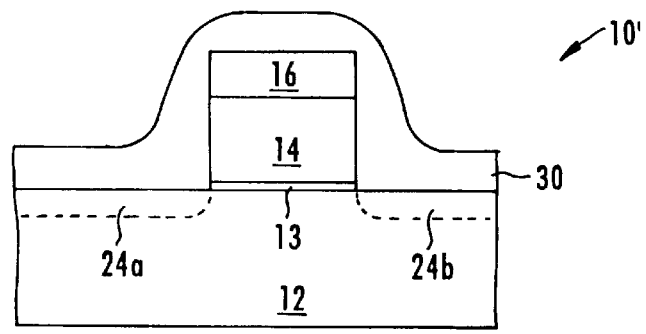
FIG. 3b depicts the portion in FIG. 3a following deposition of a first dielectric layer, in accordance with an embodiment of the present invention.
Figure 3C:
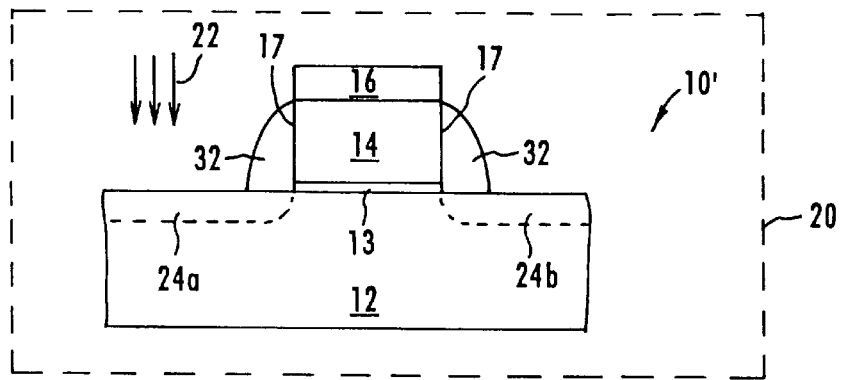
FIG. 3c depicts the portion of FIG. 3b following an etching process in which the first dielectric layer has been etched back leaving first spacers on the sidewalls of the gate, in accordance with an embodiment of the present invention.

In FIG. 3b, portion 10' has had a first conformal dielectric layer 30 deposited over the exposed portions of substrate 12, gate oxide 13, gate 14, and BARC layer 16. In accordance with one embodiment of the present invention, first dielectric layer 30 is a thin film of silicon dioxide. Next, in FIG. 3c, portion 10' has been placed within etching tool 20 and exposed once again to an etching plasma 22 that anisotropically etches away portions of first dielectric layer 30 and stops on substrate 12. The removal of portions of first dielectric layer 30 forms first spacers 32, each of which contacts a sidewall 17 of gate 14 and a portion of substrate 12. As schematically depicted in FIG. 3c, etching plasma 22 etches away a portion of BARC layer 16 during the etch back of first dielectric layer 30 to form first spacers 32.

Figure 3D:
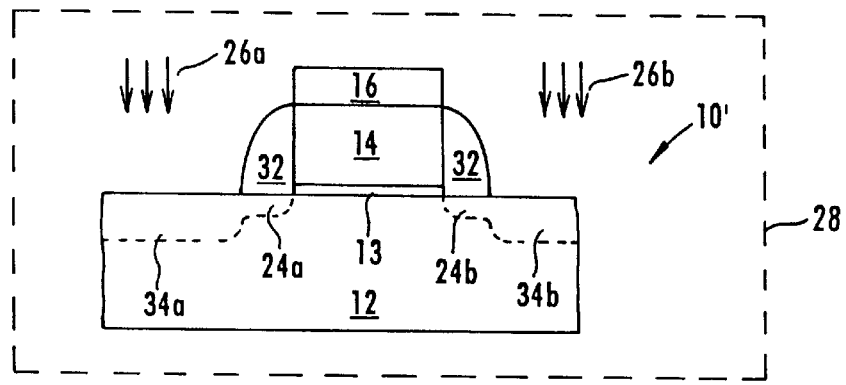
FIG. 3d depicts the portion in FIG. 3c following further formation of source and drain regions, in accordance with an embodiment of the present invention.

Portion 10' in FIG. 3d has been placed in doping tool 28 and subjected to one or more dopants 26a–b to complete the formation of source region 34a and drain region 34b within substrate 12.

Figure 3E:
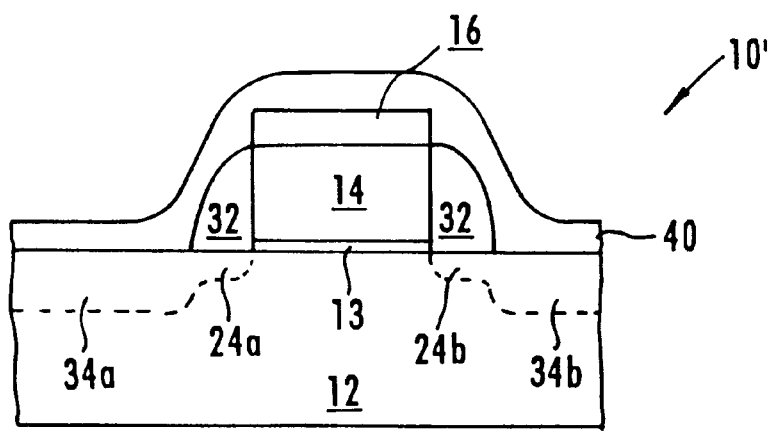
FIG. 3e depicts the portion of FIG. 3d following deposition of a second dielectric layer, in accordance with an embodiment of the present invention.

Following the formation of source region 34a and drain region 34b, a second conformed dielectric layer 40 is deposited on the exposed surfaces of portion 10', for example, as depicted in FIG. 3e using conventional deposition techniques. In accordance with one embodiment of the present invention, second dielectric layer 40 is a thin film of silicon nitride that, for example, is used for patterning a resistor protect region (not shown) on another portion of the semiconductor wafer.

Figure 3F:
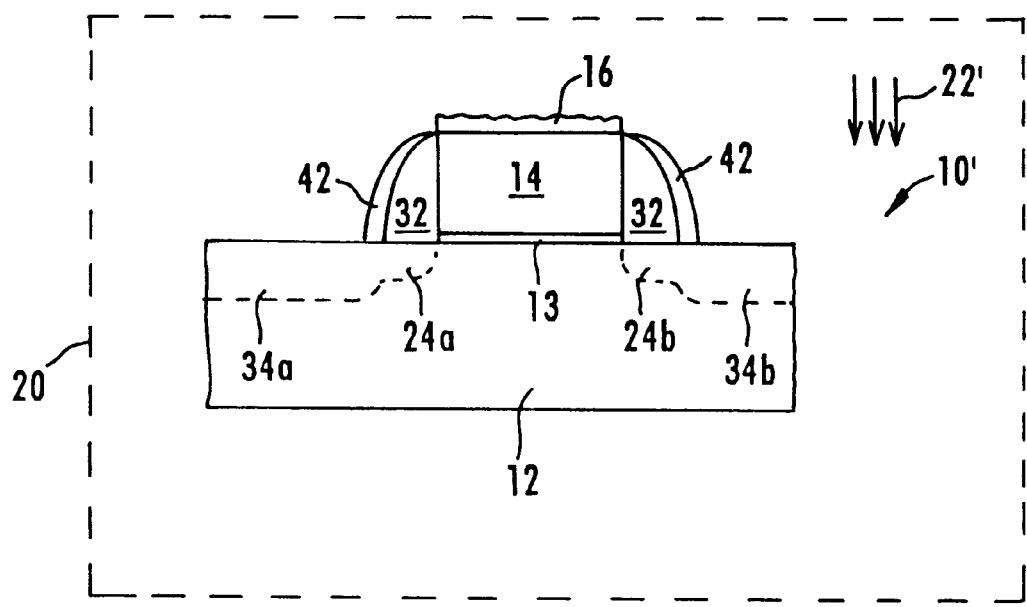
FIG. 3f depicts the portion of FIG. 3e after the second dielectric layer has been etched back to form second spacers over the first spacers, in accordance with an embodiment of the present invention.

As shown in FIG. 3f, second dielectric layer 40 is then exposed to an etching plasma 22, whose composition is selected to etch back second dielectric layer 40 and stop on substrate 12, thereby leaving second spacers 42 substantially covering first spacers 32. During this second dielectric layer etching process, still further portions of BARC layer 16 are etched away by etching plasma 22.

Figure 3G:
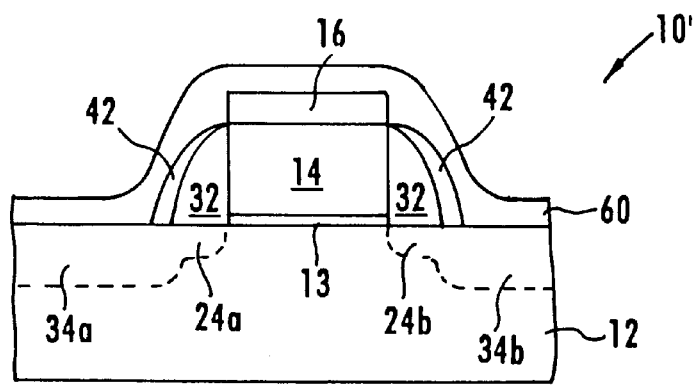
FIG. 3g depicts the portion of FIG. 3f following deposition of a third dielectric layer, in accordance with an embodiment of the present invention.

To support further fabrication of other devices/features, a third conformal dielectric layer 60 is then added to portion 10' as depicted in FIG. 3g. In certain embodiments of the invention, third dielectric layer 60 is a thin film of silicon dioxide. In other embodiments, third dielectric layer 60 is a thin film of silicon nitride or other similar dielectric material.

Figure 3H:
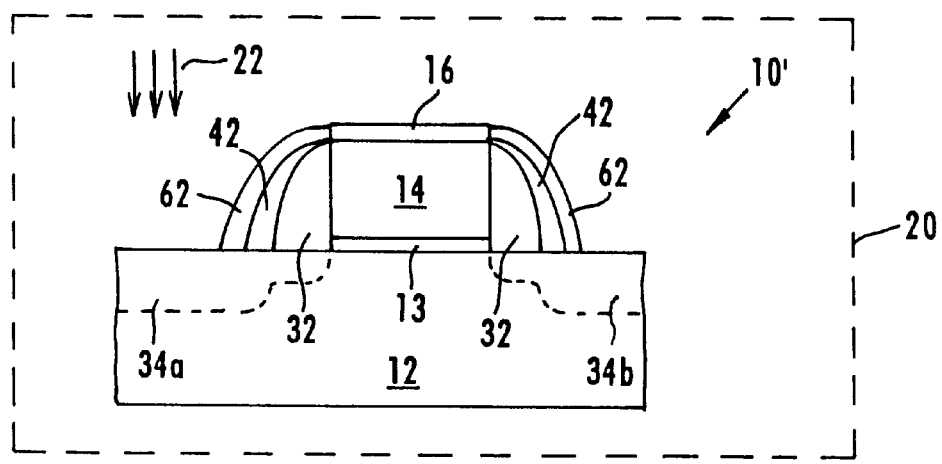
FIG. 3h depicts the portion of FIG. 3g after the third dielectric layer has been etched back to form third spacers over the second spacers, in accordance with an embodiment of the present invention.
Figure 4:
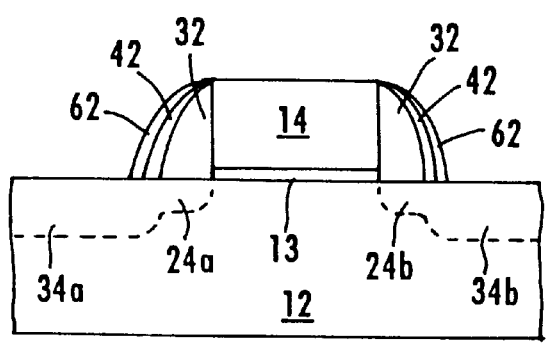
FIG. 4 depicts a portion of FIG. 3h following removal of the remaining bottom anti-reflective coating from the gate, in accordance with an embodiment of the present invention.

Portion 10' is then subjected to an etching plasma 22' that etches back third dielectric layer 60 and stop on substrate 12, thereby leaving third spacers 62 substantially covering second spacers 42, as depicted in FIG. 3h. As with the previous etching back processes, additional portions of BARC layer 16 are etched away during the etch back of third dielectric layer 60 to form third spacer 62. For example, in certain preferred embodiments, the thickness of the remaining BARC layer 16, following this third etching back process, is approximately 200 angstroms or less.

At this point, the remaining portions of BARC layer 16 can be easily removed without using an HF dip. For example, in certain embodiments of the present invention portion 10' as depicted in FIG. 3h is removed from etching tool 20 and BARC layer 16 is stripped away using a conventional phosphoric acid strip technique. Unlike an HF dip, phosphoric acid stripping does not attack and damage exposed silicon dioxide to the same extent.

The present invention allows for BARC layer 16 to be removed at this stage, without an HF dip process, because the silicon oxynitride material of BARC layer 16 is so thin, and because there will not be a substantial amount of oxidation on this very thin layer 16. Thus, the exposure of BARC layer 16 to the previous etching processes has significantly reduced BARC layer 16 to the point where a conventional phosphoric acid stripping process can effectively and efficiently remove the remaining silicon oxynitride of BARC layer 16. For example, a hot bath of phosphoric acid (e.g., $H_3PO_4$) can be used to strip the remaining portions of BARC layer 16 from gate 14.

Furthermore, by the time third dielectric layer 60 has been added and etched back to form third spacer 62, the dopant implants that were added to selected regions of substrate 12 during previous processes (including processes not described above), have been annealed, via one or more annealing steps, such as, for example, a rapid thermal anneal (RTA) process conducted prior to a resistor protect etch. Consequently, the exposed, doped silicon areas of substrate 12 and other areas of the semiconductor wafer will not be significantly affected by the phosphoric acid strip process.

Thus, the methods of the present invention simplify the stripping of BARC layer 16 by avoiding the HF dip which tends to erode exposed areas of oxide, such as, for example, gate and field oxide regions. Furthermore, because annealing has taken place, there is less chance at this stage in the fabrication process that the phosphoric acid strip used to remove the remaining portions of BARC layer 16 will damage the exposed regions of portion 10'.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A method for removing an anti-reflective coating overlaying a polysilicon gate formed over a surface of a semiconductor wafer, without exposure of the semiconductor wafer to HF acid, the method comprising the sequential steps of:

forming said polysilicon gate over said wafer surface by a process including forming a patterned anti-reflective coating overlying and in direct contact with said gate, said overlying anti-reflective coating having an initial thickness;

depositing a first conformal dielectric layer over the anti-reflective coating, the first conformal dielectric layer covering side and top surfaces of said gate and said anti-reflective coating;

removing substantially all of the first conformal dielectric layer located over the antireflective coating using a first plasma;

removing a portion of the anti-reflective coating from the gate using the first plasma, such that a first remaining anti-reflective coating portion having a first reduced thickness, that is less than the initial thickness, is left on the gate; and stripping substantially all of the remaining anti-reflective coating portion from the gate using an acid that is substantially non-reactive with silicon dioxide.

2. The method as recited in claim 1, wherein the step of stripping includes using phosphoric acid.

3. The method as recited in claim 1, wherein the anti-reflective coating comprises silicon oxynitride.

4. The method as recited in claim 3, wherein the first reduced thickness is less than about 200Å.

5. The method as recited in claim 1, further comprising, prior to stripping substantially all of the remaining anti-reflective coating portion from the gate using the first plasma, the sequential steps of:

depositing a second conformal dielectric layer over the first remaining, first reduced thickness anti-reflective coating portion;

removing substantially all of the second dielectric layer located over the first remaining, first reduced thickness anti-reflective coating portion using a second plasma;

removing a portion of the first remaining, first reduced thickness anti-reflective coating portion from the gate using the second plasma, such that a second remaining anti-reflective coating portion having a second reduced thickness that is less than the first thickness, remains on the gate.

6. The method as recited in claim 5, further comprising, prior to stripping substantially all of the remaining anti-reflective coating portion from the gate using a second plasma, the sequential steps of:

depositing a third comformal dielectric layer over the second remaining, second reduced thickness antireflective coating portion;

removing substantially all of the third conformal dielectric layer located over the second remaining, second reduced thickness anti-reflective coating portion using a third plasma;

removing a portion of the second remaining, second reduced thickness anti-reflective coating portion from the gate using the third plasma, such that a third remaining anti-reflective coating portion having a third reduced thickness that is less than the second reduced thickness, is left on the gate.

7. The method as recited in claim 3, wherein the first dielectric layer is selected from a group of dielectric materials consisting of silicon dioxide and silicon nitride.

8. The method as recited in claim 2, wherein the stripping of substantially all of the remaining anti-reflective coating portion from the gate using phosphoric acid comprises applying an $H_3PO_4$ solution.

9. The method as recited in claim 5, wherein the second reduced thickness is less than about 200Å.

10. The method as recited in claim 5, wherein the second dielectric layer is selected from a group of dielectric materials comprising silicon dioxide and silicon nitride.

11. The method as recited in claim 6, wherein the third reduced thickness is less than about 200Å.

12. The method as recited in claim 7, wherein the third dielectric layer is selected from a group of dielectric materials comprising silicon dioxide and silicon nitride.

* * * * *